(12) United States Patent
Adkisson et al.

(10) Patent No.: US 7,572,701 B2
(45) Date of Patent: Aug. 11, 2009

(54) RECESSED GATE FOR A CMOS IMAGE SENSOR

(75) Inventors: James W. Adkisson, Jericho, VT (US); John Ellis-Monaghan, Grand Isle, VT (US); Mark D. Jaffe, Shelburne, VT (US); Jerome B. Lasky, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 11/735,223

(22) Filed: Apr. 13, 2007

(65) Prior Publication Data

US 2007/0184614 A1 Aug. 9, 2007

Related U.S. Application Data

(62) Division of application No. 10/905,097, filed on Dec. 15, 2004, now Pat. No. 7,217,968.

(51) Int. Cl.
*H01L 21/02* (2006.01)
*H01L 31/113* (2006.01)

(52) U.S. Cl. .................. 438/259; 438/57; 257/291; 257/249; 257/222

(58) Field of Classification Search .......... 438/519, 438/510, 259, 262, 58, 57, 48, 54, 270, 271, 438/589; 257/291, 292, 247, 249, 233, 215, 257/223, 187, 458, 222, 225
See application file for complete search history.

(56) References Cited

U.S. PATENT DOCUMENTS 4,173,765 A 11/1979 Heald et al.
(Continued)

FOREIGN PATENT DOCUMENTS

EP 0 890 993 A2 8/2008

OTHER PUBLICATIONS

Eric C. Fox et al, SPIE, A High Speed Linear CCD Sensor with Pinned Photodiode Photosite for Low Lag and Low Noise Imaging, vol. 3301, p. 17(1998).*

(Continued)

*Primary Examiner*—Leonardo Andújar
*Assistant Examiner*—Nikolay Yushin
(74) *Attorney, Agent, or Firm*—Scully, Scott, Murphy & Presser, P.C.; Anthony J. Canale

(57) ABSTRACT

A novel CMOS image sensor cell structure and method of manufacture. The imaging sensor comprises a substrate having an upper surface, a gate comprising a dielectric layer formed on the substrate and a gate conductor formed on the gate dielectric layer, a collection well layer of a first conductivity type formed below a surface of the substrate adjacent a first side of the gate conductor, a pinning layer of a second conductivity type formed atop the collection well at the substrate surface, and a diffusion region of a first conductivity type formed adjacent a second side of the gate conductor, the gate conductor forming a channel region between the collection well layer and the diffusion region. A portion of the bottom of the gate conductor is recessed below the surface of the substrate. Preferably, a portion of the gate conductor is recessed at or below a bottom surface of the pinning layer to a depth such that the collection well intersects the channel region thereby eliminating any potential barrier interference caused by the pinning layer.

12 Claims, 6 Drawing Sheets

U.S. PATENT DOCUMENTS

| | | | |
|---|---|---|---|
| 4,296,469 A * | 10/1981 | Gunter et al. | 710/306 |
| 4,760,273 A | 7/1988 | Kimata | |
| 4,814,839 A | 3/1989 | Nishizawa et al. | |
| 5,412,227 A | 5/1995 | Zommer | |
| 5,503,017 A | 4/1996 | Mizukoshi | |
| 5,633,520 A * | 5/1997 | Wu et al. | 257/315 |
| 5,811,336 A | 9/1998 | Kasai | |
| 6,027,955 A | 2/2000 | Lee et al. | |
| 6,127,697 A | 10/2000 | Guidash | |
| 6,278,142 B1 | 8/2001 | Hynecek | |
| 6,303,448 B1 | 10/2001 | Chang et al. | |
| 6,358,800 B1 * | 3/2002 | Tseng | 438/268 |
| 6,465,820 B1 | 10/2002 | Fox | |
| 6,500,692 B1 * | 12/2002 | Rhodes | 438/73 |
| 6,531,380 B2 | 3/2003 | Li et al. | |
| 6,660,553 B2 | 12/2003 | Kimura et al. | |
| 6,713,796 B1 | 3/2004 | Fox | |
| 6,744,084 B2 | 6/2004 | Fossum | |
| 6,815,297 B1 | 11/2004 | Krivokapic et al. | |
| 6,828,609 B2 * | 12/2004 | Deboy et al. | 257/285 |
| 6,909,126 B1 | 6/2005 | Janesick | |
| 7,187,018 B2 * | 3/2007 | Mouli et al. | 257/222 |
| 7,205,591 B2 | 4/2007 | Adkisson et al. | |
| 7,334,211 B1 | 2/2008 | Toros et al. | |
| 7,378,697 B2 | 5/2008 | Rhodes | |
| 7,387,908 B2 | 6/2008 | Patrick | |
| 7,388,241 B2 | 6/2008 | Rhodes | |
| 2001/0011736 A1 | 8/2001 | Dierickx | |
| 2002/0088991 A1 | 7/2002 | Hisamoto | |
| 2003/0075719 A1 | 4/2003 | Sriram | |
| 2003/0089929 A1 | 5/2003 | Rhodes | |
| 2003/0107066 A1 | 6/2003 | Stevenson et al. | |
| 2003/0205741 A1 | 11/2003 | Rhodes | |
| 2004/0000688 A1 | 1/2004 | Harari et al. | |
| 2004/0132256 A1 * | 7/2004 | Kim et al. | 438/296 |
| 2004/0195592 A1 * | 10/2004 | Fossum | 257/202 |
| 2004/0195600 A1 * | 10/2004 | Rhodes | 257/292 |
| 2004/0211987 A1 * | 10/2004 | Chien et al. | 257/225 |
| 2004/0232497 A1 * | 11/2004 | Akiyama et al. | 257/390 |
| 2004/0262609 A1 | 12/2004 | Mouli et al. | |
| 2005/0023553 A1 | 2/2005 | Rhodes | |
| 2005/0042793 A1 | 2/2005 | Mouli et al. | |
| 2005/0051702 A1 | 3/2005 | Hong et al. | |
| 2005/0098806 A1 | 5/2005 | Rhodes | |
| 2005/0230721 A1 | 10/2005 | Patrick | |
| 2006/0001060 A1 | 1/2006 | Rhodes | |
| 2006/0011919 A1 | 1/2006 | Mouli | |
| 2006/0118835 A1 | 6/2006 | Ellis-Monaghan et al. | |
| 2006/0124976 A1 | 6/2006 | Adkisson et al. | |
| 2006/0170009 A1 | 8/2006 | Kitano et al. | |

OTHER PUBLICATIONS

A.EI Gamel & Helmy Eltoukhy, CMOS Image Sensors, IEEE Circuits & Device Magazine, May/Jun. 2005, p. 6-20.*

Bhatia, et al., "Elimination of Parasitic Currents in Transistor-Schottky Barrier Diode Circuit", vol. 19, No. 7, Dec. 1976.

* cited by examiner

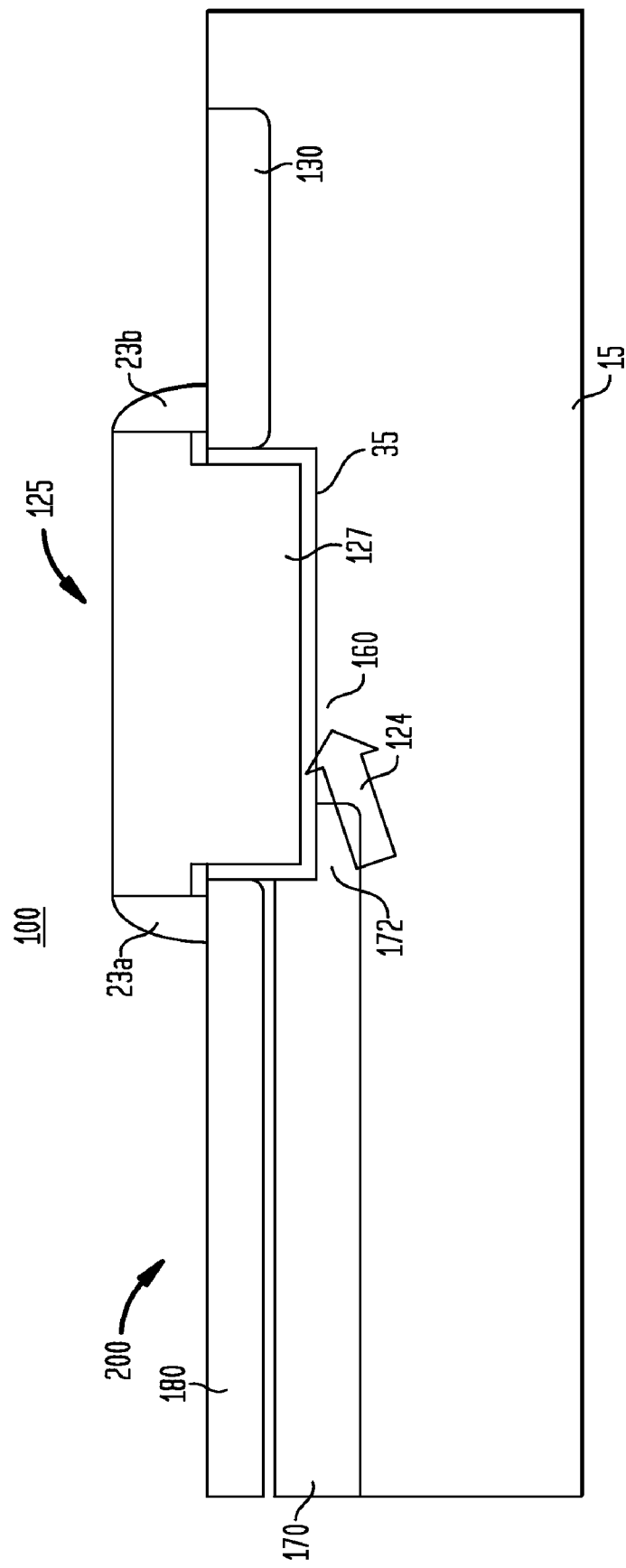

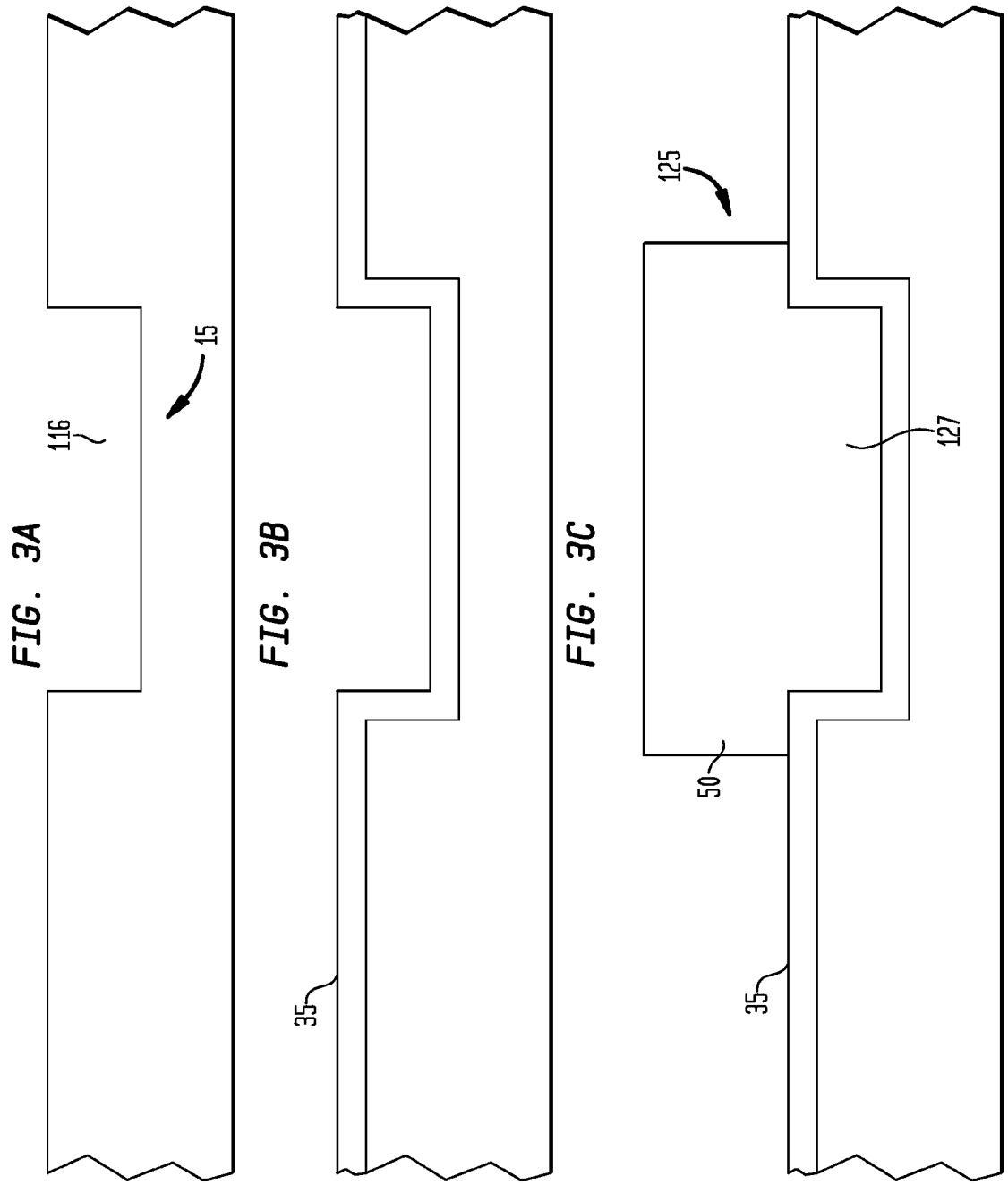

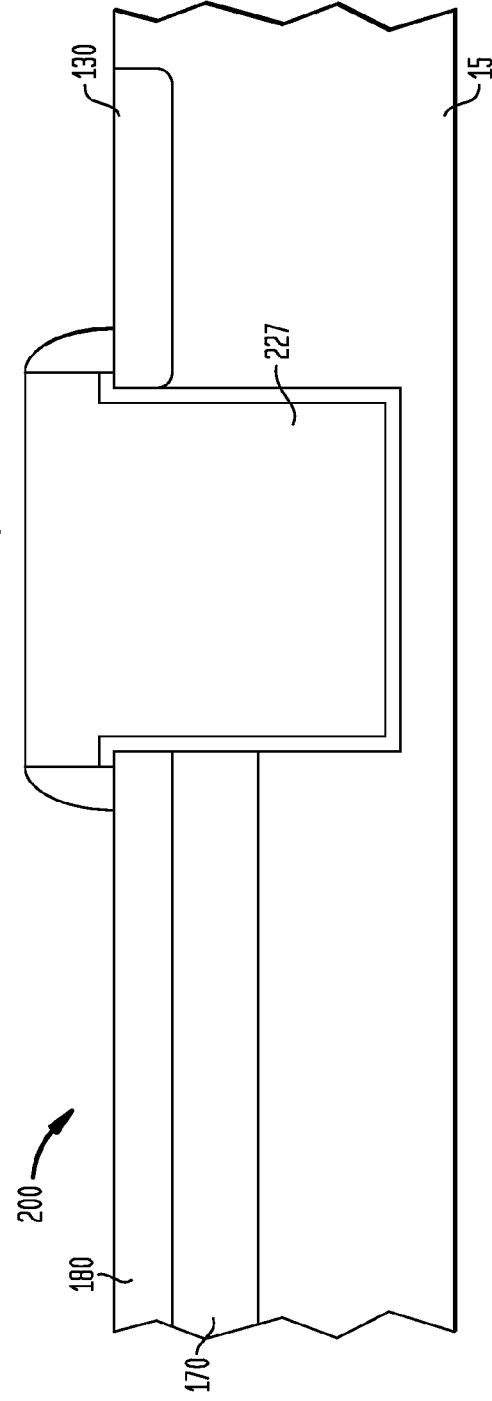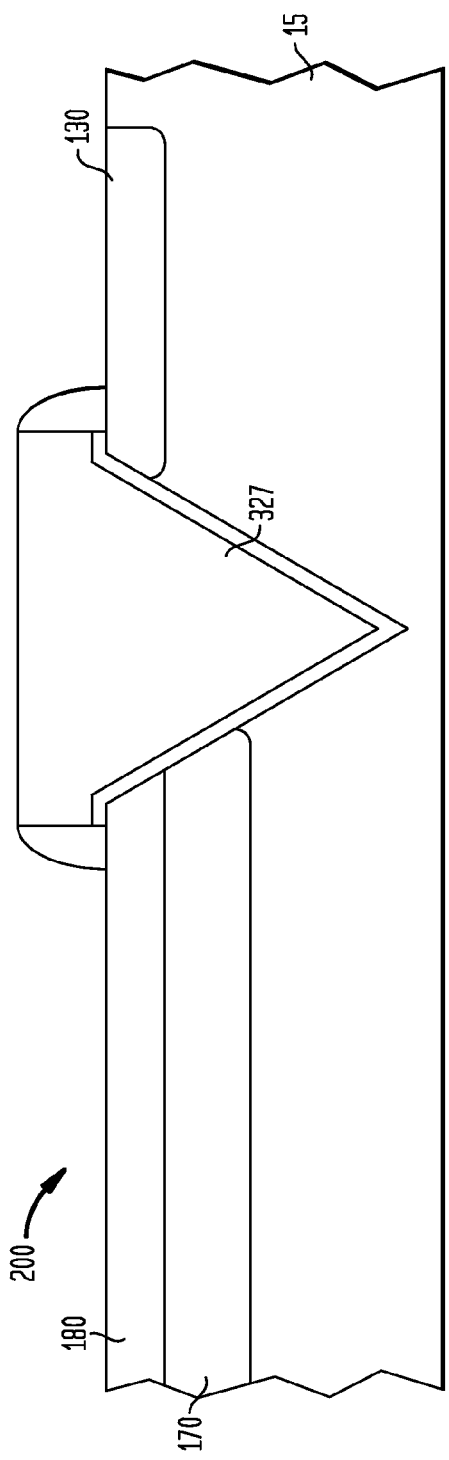

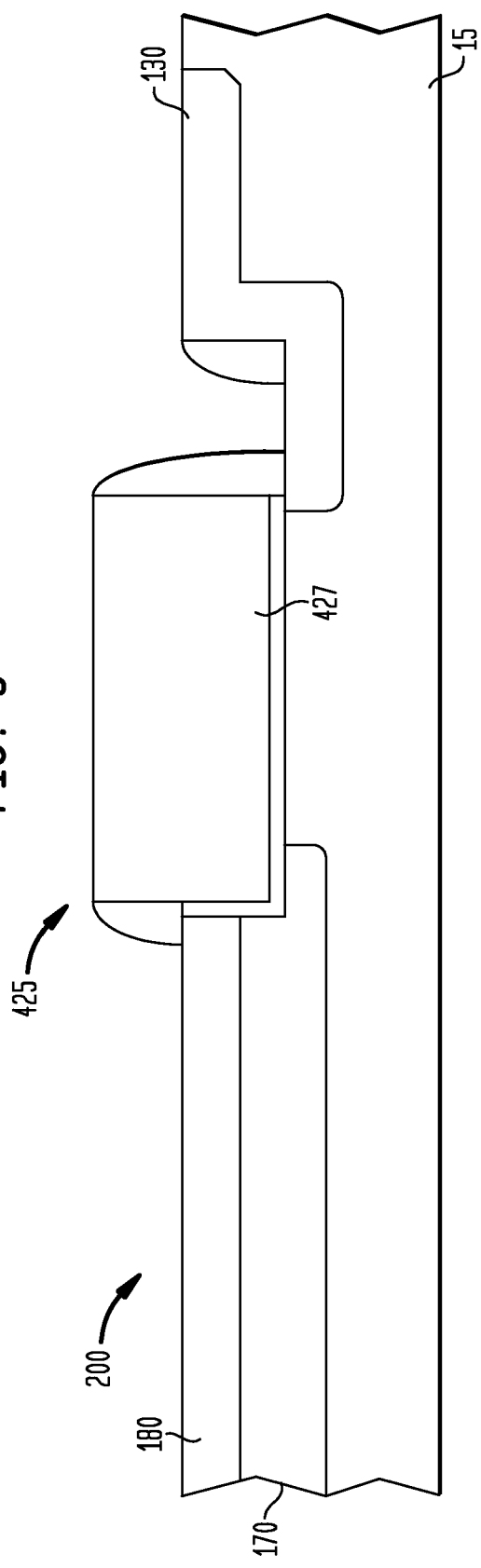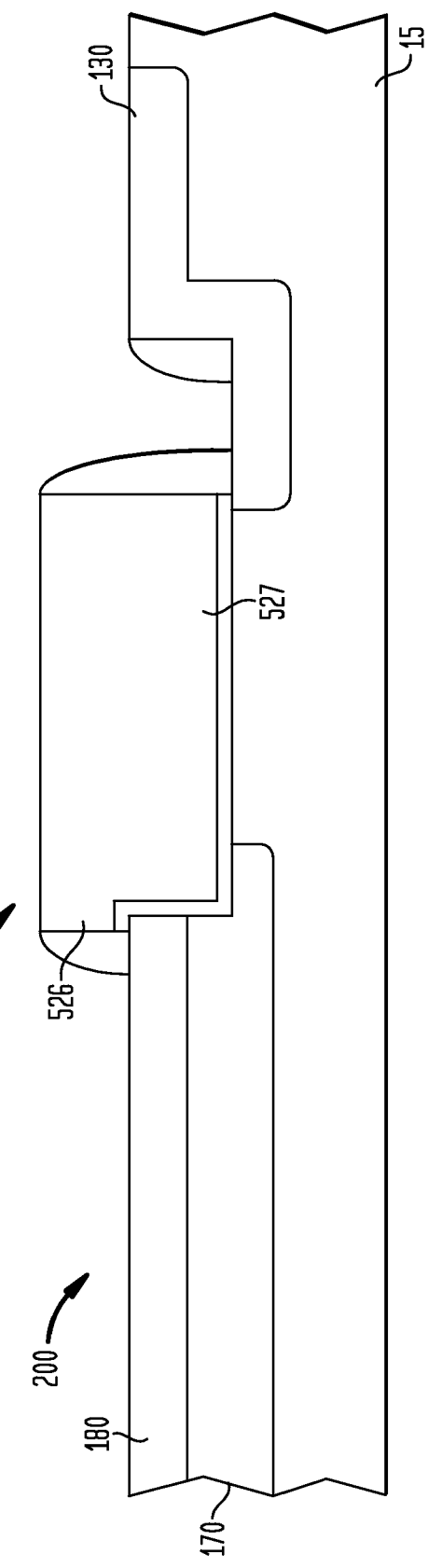

RECESSED GATE FOR A CMOS IMAGE SENSOR

RELATED APPLICATIONS

This application is a divisional of U.S. application Ser. No. 10/905,097, filed Dec. 15, 2004.

FIELD OF THE INVENTION

The present invention related generally to the fabrication of semiconductor pixel imager arrays, and more particularly, to a novel Active Pixel Sensor (APS) cell structure including a novel transfer gate and process therefore.

BACKGROUND OF THE INVENTION

CMOS image sensors are beginning to replace conventional CCD sensors for applications requiring image pickup such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

Current CMOS image sensors comprise an array of CMOS Active Pixel Sensor (APS) cells, which are used to collect light energy and convert it into readable electrical signals. Each APS cell comprises a photosensitive element, such as a photodiode, photo gate, or photoconductor overlying a doped region of a substrate for accumulating photo-generated charge in an underlying portion thereof. A read-out circuit is connected to each pixel cell and often includes a diffusion region for receiving charge from the photosensitive element, when read-out. Typically, this is accomplished by a transistor device having a gate electrically connected to the floating diffusion region. The imager may also include a transistor, having a transfer gate, for transferring charge from the photosensitive element to the floating diffusion region, and a transistor for resetting the floating diffusion region to a predetermined charge level prior to charge transfer.

As shown in FIG. 1, a typical CMOS APS cell 10 includes a pinned photodiode 20 having a pinning layer 18 doped p-type and, an underlying lightly doped n−type region 17. Typically, the pinned diode 20 is formed on top of a p-type substrate 15 or a p-type epitaxial layer or p-well surface layer having a lower p-type concentration than the diode pinning layer 18. The n-region 17 and p region 18 of the photodiode 20 are typically spaced between an isolation region (not shown) and a charge transfer transistor gate 25 which are surrounded by thin spacer structures 23a,b. The photodiode 20 thus has two p-type regions 18 and 15 having a same potential so that the n-region 17 is fully depleted at a pinning voltage (Vp). The pinned photodiode is termed "pinned" because the potential in the photodiode is pinned to a constant value, Vp, when the photodiode is fully depleted. In operation, light coming from the pixel is focused down onto the photodiode through the diode where electrons collect at the n−type region 17. When the transfer gate 25 is operated, i.e., turned on, the photo-generated charge 24 is transferred from the charge accumulating doped n⁻ type region 17 via a transfer device surface channel 16 to a floating diffusion region 30 which is doped n+ type.

A first problem with these current CMOS Imaging cells with a charge transfer gate 25 (e.g., a "4" Transistor cell) is the definitional problem of controlling the readout of the charge. The p type surface pinning layer 18 is necessary for low dark current, but can create a potential barrier between the n− type charge collection well 17 and the transfer device channel 16. The structure as currently practiced by the industry is also very sensitive to normal manufacturing process variations. Overlay and image size variation of the block masks is critical for cell operation.

For example, in conventional processes for fabricating the pinning layer 18 over the photodiode in the prior art APS cell 10 shown in FIG. 1, it is the case that some amount of p doping 29 overlaps onto the transfer gate 25 which is normally formed of intrinsic polysilicon or low level p-type doped 27. This is a result of mask overlay tolerance or displacement of the mask edge during fabrication. Subsequently, during formation of the n+ type doped floating diffusion region 30, the gate is processed to include a n+ type doped region 28. The presence of this p doping has an effect of reducing the efficiency and dynamic range of the gate, particularly by causing variations in transfer gate voltage thresholds ($V_t$). This will cause the transfer gate to not turn on completely. Also, because of lithographic alignment issues, the position of the p 'overlap' onto the gate varies, leading to performance variability.

A second problem is that the transfer gate structure 25 as defined takes up a lot of space in the cell leading to lower cell fill factor (the percentage of the cell that functions as a light collection area). One of the reasons for this is that there are multiple block levels whose overlay and image size goes into the minimum transfer gate length. If the n+ type floating diffusion region 30 is implanted on the collection side of the transfer gate, it will create excess leakage. If the p type surface pinning layer is implanted on the drain side of the gate, it will create a series resistance for the device. Both of these layers must abut the transfer gate on one side. The n−type charge collection layer 17 must somewhat overlap the gate or there will be a large potential barrier to charge transfer, but if it overlaps too much, the device will suffer from short channel effects.

Variation in the concentration distribution of the impurity dopant in the n−type collection well region 17, along with alignment, may cause both variation in the properties of the photodiode as well as create a potential barrier to occur immediately under the gate electrode. This effects the charge transfer efficiency of the transfer MOS transistor which in turn may degrade performance of the CMOS image sensor. Prior art teaches the use of oblique-rotating implantation or the use of excessive thermal diffusion to position or move the dopant under the gate structure 25 to minimize the potential barrier. U.S. Pat. No. 6,660,553 describes a method whereby an implant mask is used to form a photodiode which is partly situated under the gate.

Structures and methods that minimize the potential barrier and the parametric variability of the transfer gate are of great value for CMOS sensors.

It would thus be highly desirable to provide a novel CMOS image sensor APS cell structure and method of manufacture whereby the transfer gate is recessed such that the charge collection well intersects the bottom of the transfer gate channel.

SUMMARY OF THE INVENTION

This invention addresses a novel CMOS image sensor APS cell structure and method of manufacture. Particularly, a CMOS image sensor APS cell having a recessed transfer gate is fabricated such that the charge collection well intersects the bottom of the transfer gate channel.

According to the embodiment of the invention, the CMOS image sensor APS cell structure includes a doped p pinning layer and an N+ doped gate. There is additionally provided a method of forming the CMOS image sensor APS cell having a transfer gate that is recessed such that the transfer channel intersects the collection well. This improves the control of the readout of the charge of the imaging cell as the pinning layer no longer has the ability to produce a potential barrier to charge transfer. By recessing the transfer gate, not only is the pinning layer out of the way of charge transfer, but now the transfer device characteristics are not sensitive to the alignment overlay of the block levels.

According to a first aspect of the invention, there is provided a CMOS optical imaging sensor comprising: a substrate having an upper surface; a gate conductor having at least a portion recessed below the upper substrate surface; a collection well region formed adjacent a first side of the gate conductor and a diffusion region formed adjacent a second side of the gate conductor. The imaging sensor further comprises a pinning layer formed on an upper surface of the collection well. At least one portion of the gate conductor is recessed below the pinning layer. Moreover, the imaging sensor collection well intersects a channel region formed by the gate conductor. Recessing the transfer gate relieves the problem as the surface pinning layer no longer produces a potential barrier to charge transfer. By recessing the transfer gate, not only is the pinning layer out of the way of charge transfer, but now the transfer device characteristics are not sensitive to the alignment overlay of the block levels.

According to a second aspect of the invention, there is provided a method for fabricating an active pixel sensor (APS) cell structure for a CMOS imager comprising the steps of: etching a trench into a semiconductor substrate to define a recessed portion of an image cell transfer gate below a substrate surface; forming a layer of dielectric material over the semiconductor substrate and including the recessed portion; filling tie recessed portion with polysilicon material atop the dielectric material layer and forming a polysilicon gate layer above the substrate surface; etching the polysilicon gate layer to define a portion of the image cell transfer gate above the substrate surface; forming a doped pinning layer comprising material of a first conductivity type in the substrate at a first side of the transfer gate; forming a doped collection well layer comprising material of a second conductivity type beneath the doped pinning layer; and, forming a doped diffusion layer of a second conductivity type in the substrate at an opposite side of the predoped transfer gate, the recessed portion of the image cell transfer gate forming a channel region enabling charge transfer between the collection well layer and the diffusion region, wherein the recessed portion of an image cell transfer gate extends to a depth below the pinning layer. Preferably, the recessed portion of the image cell transfer gate extends to a depth below the formed doped collection well layer such that the doped collection well layer intersects the channel region to thereby eliminate any potential barrier interference to charge transfer caused by the formed pinning layer.

Advantageously, the design of the recessed transfer gate allows the design of a much smaller cell, or at least a cell with smaller transfer gate area and thus higher fill factor.

BRIEF DESCRIPTION OF THE DRAWINGS

The objects, features and advantages of the present invention will become apparent to one skilled in the art, in view of the following detailed description taken in combination with the attached drawings, in which:

FIG. 2 illustrates the CMOS image sensor APS cell 100 of the present invention;

FIGS. 3(a)-3(c) depict, through cross-sectional views, the process steps for forming the CMOS APS cell 100 of the present invention and resulting in the structure shown in FIG. 2;

FIG. 4 depicts, through a cross-sectional view, a transfer gate fabricated to include a recessed portion etched significantly deeper than the transfer gate etch depth according to the first embodiment (see FIG. 2);

FIG. 5 depicts, through a cross-sectional view, a transfer gate fabricated to include a "V" shaped recessed portion;

FIG. 6 depicts, through a cross-sectional view, a transfer gate fabricated to include an upper gate portion that is equal in width or narrower than the recessed trench portion;

FIG. 7 depicts, through a cross-sectional view, a transfer gate fabricated that includes an extended gate portion above the substrate surface that overlaps the recess on the photodiode collection side; and, FIG. 8 illustrates, through a cross-sectional view, a transfer gate fabricated to have having a smaller width than the previous embodiments, and, as deep a recessed gate portion as the technology permits.

DETAILED DESCRIPTION OF THE PREFERRED EMBODIMENTS

Figure 1:
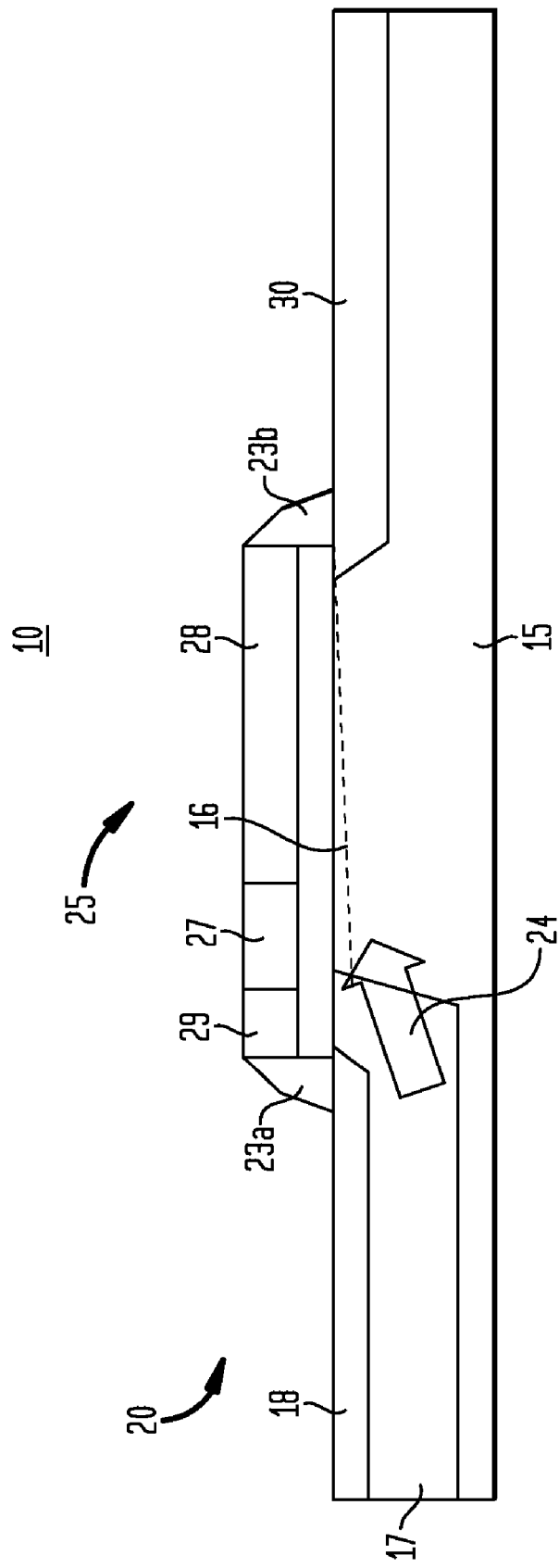
FIG. 1 depicts a CMOS image sensor pixel array 10 according to the prior art.

FIG. 2 illustrates the CMOS image sensor APS cell 100 of the present invention. As shown in FIG. 2, the APS cell 100 includes a transfer gate 125 formed on top of a gate dielectric material layer 35 which is formed on top of a semiconductor substrate 15 having a recessed portion 127 formed below the substrate surface. Abutting one side of the transfer gate is a photodiode 200 comprising a surface pinning layer 180 doped with material of a first conductivity, e.g., p type material dopant, and an charge collection well 170 doped with material of a second conductivity, e.g., n type material dopant, formed directly underneath the pinning layer.

Abutting the other side of the transfer gate is a gate diffusion region 130 comprising doped with material of a second conductivity, e.g., n type material dopant. As shown in FIG. 2, the transfer gate channel 160 fanned underneath the transfer gate 125 intersects a portion 172 of the subsequently formed abutting charge collection well region 170. The recessed transfer gate 125 helps overcome the limitations of the prior art APS cell structure as the surface pinning layer 180 no longer has the ability to produce a potential barrier to charge transfer. By recessing the transfer gate, the pinning layer 180 does not affect charge transfer as it no longer intersects the path 124 of charge transfer, but additionally renders the transfer device characteristics not sensitive to the alignment overlay of the block levels. The charge collection well 170 is thus formed to intersect the bottom of the transfer gate channel 160. Thus, there is no potential barrier interference from the pinning layer 180.

The method to create a recessed transfer gate 125 is now described. As shown in FIG. 3(a), there is provided a substrate 15 which may be a bulk semiconductor including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description, substrate 15 is a Si-containing semiconductor substrate of a first conductivity type, e.g., lightly doped with p-type dopant material such as boron or indium (beryllium or magnesium for a III-V semiconductor), to a standard concentration ranging between, e.g., $1e^{14}$ to $1e^{16}$ cm$^{-3}$. Next, using standard processing techniques, a trench recess is formed in the substrate. That is, utilizing a trench lithography, a photoresist mask (not shown) is applied, patterned and developed to expose an open region for forming a trench etch. Subsequently, an etch process is performed through the opening in the mask to form a trench recess 116 that extends down below the substrate surface to a depth of about 0.1 μm to 1 μm or, at least to a depth such that a subsequently formed collection well intersects the bottom of the channel region so that potential barrier interference from the pinning layer is eliminated. Preferably, the trench recess 116 formed according to this process has a width less than about the typical 0.4-0.9 μm transfer gate features present in 0.18 micron technology node processing.

Subsequent to the formation of the trench 116, a dielectric material layer 35 is formed by standard deposition or growth techniques atop the substrate 15 that will form the eventual transfer gate dielectric. The dielectric layer is typically formed to a thickness ranging between 35 Å to 100 Å and may comprise suitable gate dielectric materials including but not limited to: an oxide (e.g., $SiO_2$), a nitride (e.g., silicon nitride) an oxynitride (e.g., Si oxynitride), $N_2O$, NO, $ZrO_2$, or other like materials. The dielectric layer 35 is formed on the surface of the Si-containing semiconductor substrate 15 and on the sidewalls and bottom surface of trench 116 using conventional thermal oxidation or by a suitable deposition process such as chemical vapor deposition, plasma-assisted chemical vapor deposition, evaporation, sputtering and other like deposition processes. Although it is not shown, it is understood that the dielectric layer may comprise a stack of dielectric materials.

Next, a gate layer 50, is deposited to fill the trench 116 and form a layer above the gate dielectric layer 35 using conventional deposition processes including, but not limited to: CVD, plasma-assisted CVD, sputtering, plating, evaporation and other like deposition processes (e.g., a low pressure CVD). This layer may be comprised of any conductor including metals, silicides, or polysilicon. For purposes of description, an intrinsic polysilicon layer is used. The intrinsic polysilicon layer structure formed atop the dielectric layer surface to a thickness ranging between about 1 k Å to 2 k Å however, may be outside this range. It is understood that for proper operation polysilicon gate, layer 50, must be doped with the second conductivity type, e.g. n-type, to a concentration in the range of $1e^{18}$ cm$^{-3}$ to $1e^{19}$ cm$^{-3}$. This maybe accomplished by the standard practice of utilizing the source/drain implants or by predoping the polysilicon before etch, or by using insitu doped polysilicon.

Regardless of whether or not the formed gate polysilicon layer 50 is doped, e.g., subsequently by ion implantation or, in-situ doped and deposited, the transfer gate is then formed to result in the structure shown in FIG. 3(c), whereby a photo lithographic process is used to define the gate region. This step is not illustrated since there are many different ways how the lateral size and shape of tie gate can be defined. Typically, an etch window is provided in a resist mask (not shown), and one or more etch processes are performed, e.g., a reactive ion etch process, that is optimized to ensure proper etching of the doped polysilicon layer 50 and dielectric layer 35 or dielectric layer stack. Chemical Mechanical Polish techniques can also be used to define the gate, and may be the preferred method when using metal gates. The resulting structure of the transfer gate 125 polysilicon layer 50 is shown in FIG. 2 which illustrates the width of the formed transfer gate poly region above the substrate surface to be slightly wider than the width of the trench portion 127 of the transfer gate trench.

In a further step (not shown), gate sidewall spacers 23a,b are formed at either side of the transfer gate by conventional deposition processes well known in the art, and may comprise any conventional oxide or nitride (e.g., $Si_3N_4$) or oxide/nitride and then they are etched by RIE or another like etch process. The thickness of spacers 23a,b may vary, but typically they have a thickness of from about 10 nm to about 150 nm. The photodiode pinning region is typically created after forming spacers in a further step (not shown). It may also be created at other points in the process. This step comprises applying a photoresist layer patterning, and etching an ion implantation mask according to techniques known in the art to form a mask edge approximately coincident with the gate edge or as close as possible given alignment tolerances, to provide an opening to an area between an edge of the gate and a formed isolation region, e.g., STI region (not shown), where the charge accumulation region of tie photodiode is to be formed. This opening permits the implantation of ions of p-type dopant material such as boron at a concentration sufficient to form the p-type dopant regions as shown in FIG. 2 up to the edge of the spacer 23a. The active p-type dopant material is ion implanted at dosing concentrations ranging between $1e^{17}$ cm$^{-3}$ and $1e^{19}$ cm$^{-3}$.

Although not shown, a farther step is to ion implant the n-type doping region of the photodiode. Thus, using the same ion implantation mask as in the previous step, an ion implantation process is performed to implant dopant material of the second conductivity type, e.g., n-type dopant material, such as phosphorus, arsenic or antimony, to form the charge collection layer beneath the ion implanted p type pinning layer 180. The n-type dopant material is implanted at higher energy levels to form the n-type doped region 170 of the photodiode 100 as shown in the figures. The active n-type dopant material is ion implanted at dosing concentrations ranging between $1e^{16}$ cm$^{-3}$ and $1e^{18}$ cm$^{-3}$. Although not shown, the photosensitive charge storage region 170 for collecting photo-generated electrons may be formed by multiple implants to tailor the profile of the n-type region 170. It is understood that an implantation angled relative to the gate surface may be conducted to form the p pinning layer 180 and n-type region 170. It should be understood that, alternatively, the p pinning photodiode surface layer 180 may be formed by other known techniques and may be formed subsequent to or before forming the n charge collection layer. For example, the p surface layer 180 may be formed by a gas source plasma doping process, or by diffusing a p-type dopant from the in-situ doped layer or a doped oxide layer deposited over the area where photodiode 200 is to be formed.

In addition to the forming of the photodiode 200, an additional step of forming an n-type floating diffusion region at the other side of the transfer gate is performed. This step comprises forming a photoresist layer and patterning and etching an ion implantation mask according to techniques known in the art to form a mask edge approximately coincident with the gate edge or as close as possible given alignment tolerances, to provide an opening allowing the implantation of n-type dopant material, such as phosphorus, arsenic or antimony, at a concentration sufficient to form the n+-type doped floating diffusion region 130 as shown in the figures up to the edge of the spacer 23b as shown in the structure depicted in FIG. 2. The active n+-type dopant material is ion implanted at the floating diffusion region at dosing concentrations ranging between $1e^{18}$ cm$^{-3}$ and $1e^{20}$ cm$^{-3}$.

There are several alternate embodiments to this invention that can add value to the basic idea shown and described with respect to FIG. 2. For instance, it should be understood that the present invention contemplates transfer gate recessed portions formation of varying shapes and sizes by a variety of known techniques. That is, the depth of the transfer gate is variable and, the width of the transfer gate with respect to the recess trench is variable. For example, in a first alternate embodiment, as shown in FIG. 4, a transfer gate 225 may be fabricated that includes a trench 227 etched significantly deeper than the transfer gate etch depth 116 according to the first embodiment (See FIG. 3(b)). That is, as shown in the first embodiment, the transfer gate etch depth 116 is required to be only slightly deeper than the p doped surface pinning layer 180 (which is typically about 0.1 μm deep). However, it may be beneficial to make the recess quite deep, e.g., to a depth ranging between about 0.3-1.0 μm with a preferred depth of about 0.5 μm-0.6 μm. If the recess is deeper than the n-type charge collection layer 170, then the resulting transfer gate channel length is independent of the overlay of the n charge collection well to the transfer gate. This may also help scaling by allowing a narrower transfer gate width since the total channel length will still be long. In a second alternate embodiment, as shown in FIG. 5, a transfer gate 325 may be fabricated that includes a "V" shaped trench recess portion 327 which, as known to skilled artisans, may be created by implementing a substrate wet etch process, e.g., that will stop on the <111> crystallographic plane which will provide about a 54.7 degree angle between the sidewall angle of the "V" and the surface, to form the "V" shaped trench recess which may be beneficial for surface state reduction as known in the art. In a further alternate embodiment, as shown in FIG. 6, a transfer gate 425 may be fabricated that is equal in width or narrower than the recess trench portion 427. In a further alternate embodiment, as shown in FIG. 7, a transfer gate 525 maybe fabricated that includes an extended gate portion 526 overlapping the recess on the photodiode collection side. This is different than the first embodiment depicted in FIG. 2 wherein the transfer gate width is wider than the recess and overlaps on both sides of the gate. That is, as shown in FIG. 7, the transfer gate overlaps with the recess on the photodiode collection side.

Figure 8:
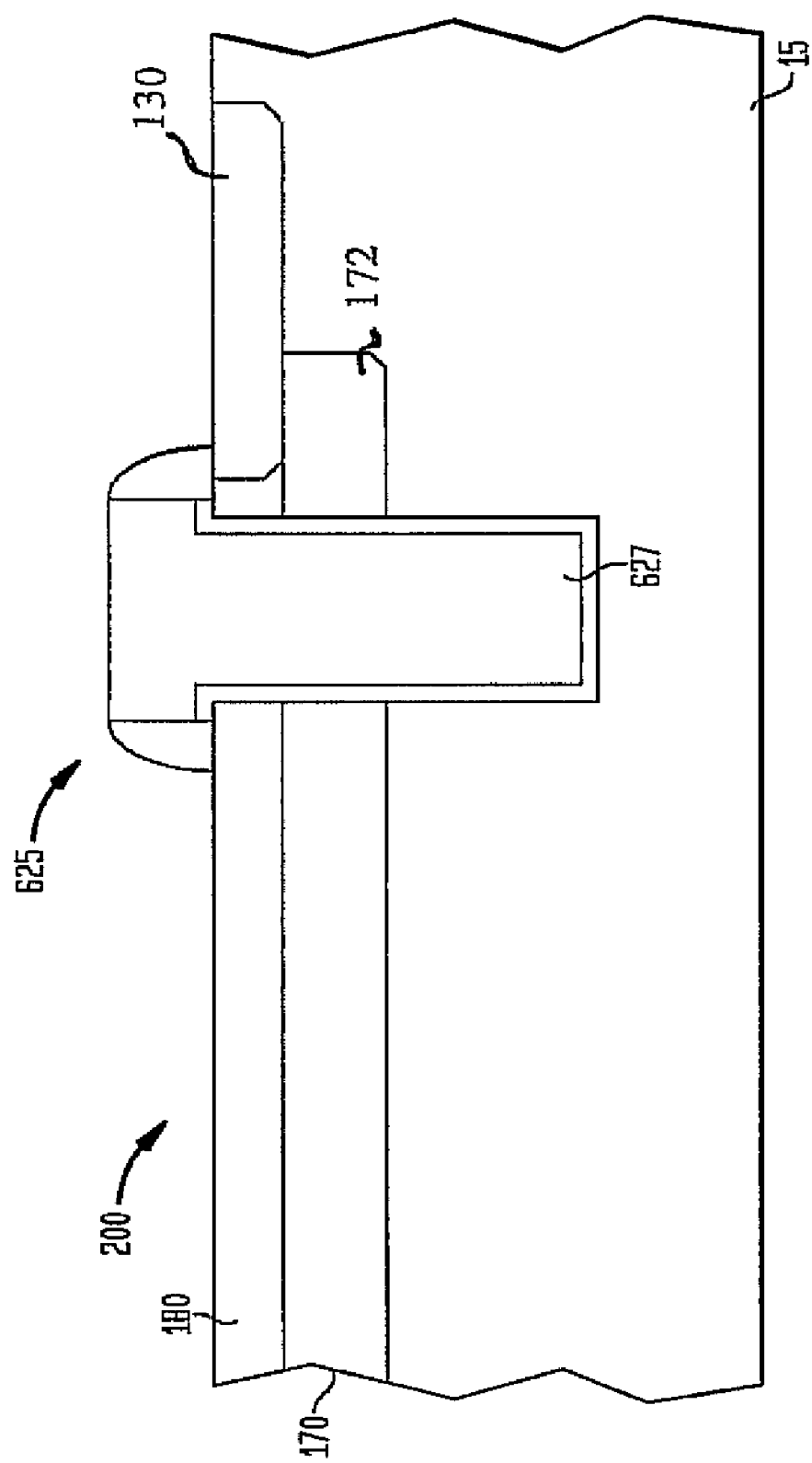

It is understood that, if the transfer gate is designed to be deep, the cell can be scaled aggressively. In the traditional cell layout, the p type surface pinning layer 180, the n-type charge collection well 170, and the n+ type diffusion region 130 all need to be lithographically aligned so that they do not cross the gate. This requirement forces a long transfer gate length. With a deep recess, however, all of these overlay tolerances can be eliminated by proper design. That is, the n-type charge collection well 170 would need to be designed to intentionally cross the transfer gate and would form the connection to the n+ drain contact. Overlay of this well 170 to the gate edge would not be critical. Further, although not shown, the p type surface pinning layer 180 may be formed to cross the transfer gate since it is no longer in tie conducting path. The n+ diffusion region 130 would not be allowed to cross the gate, but because of the charge collection well 170, it would not need to abut the gate. The combination of these features allows for a much smaller cell such as shown in the further alternate embodiment as shown in FIG. 8, which depicts an APS cell including a transfer gate 625 having a smaller width than the previous embodiments, and, a deeper recessed gate portion 627 as the technology permits between about 0.3-1.0 μm. As further shown in FIG. 8, the n-type charge collection well 170 includes a region 172 intentionally crossing over the transfer gate 627 and forms a connection to the n+ type doped diffusion region 130, e.g., a drain contact.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method of forming an active pixel sensor (APS) cell structure comprising the steps of:
   a. etching a trench into a semiconductor substrate to define a recessed portion of said APS cell structure below a substrate surface;
   b. forming a layer of dielectric material over said recessed portion;
   c. filling said recessed portion with a conductive material atop said dielectric material layer to form a gate conductor;
   d. forming a doped pinning layer comprising material of a first conductivity type in said substrate at a first side of said gate conductor;
   e. forming a doped collection well layer comprising material of a second conductivity type beneath said doped pinning layer; and,
   f. forming a doped diffusion layer of a second conductivity type in said substrate having at least a portion formed at said surface of said substrate and adjacent a second side of said gate conductor, said recessed portion of said gate conductor forming a channel region enabling charge transfer between said collection well layer and said diffusion region,
      wherein said recessed portion of an image cell transfer gate extends to a depth below the formed doped collection well layer such that the doped collection well layer intersects said channel region to thereby eliminate any potential baffler interference to charge transfer caused by said formed pinning layer.

2. The method of forming an APS cell structure as claimed in claim 1, wherein a portion of the gate conductor is recessed below the surface to a depth at or below a bottom surface of said pinning layer.

3. The method of forming an APS cell structure as claimed in claim 1, wherein the doped collection well layer includes a doped collection well layer portion adjacent said second side of said gate conductor overlapped by said doped diffusion region and forming a connection therewith.

4. The method of forming an APS cell structure as claimed in claim 1, wherein said step a) of etching a trench into a semiconductor substrate includes performing a V-shaped etch to define a V-shaped recessed portion of an image cell transfer gate below said substrate surface.

5. The method of forming an APS cell structure as claimed in claim 1, wherein a width of said portion of said image cell transfer gate above said substrate surface is wider than a width of said recessed portion of said image cell transfer gate below said substrate surface.

6. The method of forming an APS cell structure as claimed in claim 1, wherein a width of said portion of said image cell transfer gate above said substrate surface is equal to or narrower than a width of said recessed portion of said image cell transfer gate below said substrate surface.

7. The method of forming an APS cell structure as claimed in claim 1, wherein after said etching step d), the further step of forming gate sidewall spacers at either side of the image cell transfer gate above said substrate surface.

8. The method of forming an APS cell structure as claimed in claim 1, wherein said conductive material comprises polysilicon and said gate conductor comprises a polysilicon gate layer above said substrate surface, wherein after said step c), the step of doping said gate layer of polysilicon above and below the substrate surface with a second conductivity type material.

9. The method of forming an APS cell structure as claimed in claim 8, wherein said step of doping said gate layer of polysilicon material comprises blanket doping said polysilicon gate layer above and below said substrate surface by ion implanting dopant material of said second conductivity type.

10. The method of forming an APS cell structure as claimed in claim 8, wherein said step c) further comprises filling said recessed portion with polysilicon material in-situ doped with dopant material of a second conductivity type atop said dielectric material layer and forming an polysilicon gate layer in-situ doped with dopant material of a second conductivity type above said substrate surface.

11. The method of forming an APS cell structure as claimed in claim 1, wherein said step d) of forming said doped material pinning layer comprises: applying a photoresist mask structure defining an ion implant opening having an edge thereof in alignment with a first edge of said transfer gate, and; ion implanting said dopant material of said first conductivity type in said opening.

12. The method of forming an APS cell structure as claimed in claim 11, wherein said step f) of forming said doped collection well beneath said doped pinning layer comprises: applying said photoresist mask structure defining said ion implant opening, and; ion implanting said dopant material of said second conductivity type in said opening at energy levels greater than energy levels used for ion implanting said dopant material said first conductivity type in said opening.

* * * * *